(12) United States Patent
Zhang et al.

(10) Patent No.: US 10,697,900 B2
(45) Date of Patent: Jun. 30, 2020

(54) CORRELATING SEM AND OPTICAL IMAGES FOR WAFER NOISE NUISANCE IDENTIFICATION

(71) Applicant: KLA-Tencor Corporation, Milpitas, CA (US)

(72) Inventors: Qiang Zhang, Fremont, CA (US); Grace H. Chen, Los Gatos, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 16/394,723

(22) Filed: Apr. 25, 2019

(65) Prior Publication Data

US 2019/0383753 A1 Dec. 19, 2019

Related U.S. Application Data

(60) Provisional application No. 62/687,192, filed on Jun. 19, 2018.

(51) Int. Cl.
*G01N 21/00* (2006.01)
*G01N 21/95* (2006.01)
(Continued)

(52) U.S. Cl.
CPC ... *G01N 21/9501* (2013.01); *G01N 21/95607* (2013.01); *G01N 23/2251* (2013.01);
(Continued)

(58) Field of Classification Search
CPC ......... G01N 21/9501; G01N 21/95607; G01N 23/2251; G01N 2021/95615;
(Continued)

(56) References Cited

U.S. PATENT DOCUMENTS

2002/0113234 A1  8/2002  Okuda et al.
2013/0308197 A1  11/2013  Duparre
(Continued)

FOREIGN PATENT DOCUMENTS

WO  2016018913 A1  2/2016

OTHER PUBLICATIONS

International Search Report—PCT/US2019/036872, International Filing date of Jun. 13, 2019, 4 pages.

*Primary Examiner* — Peter B Kim
(74) *Attorney, Agent, or Firm* — Kwan & Olynick LLP

(57) ABSTRACT

Disclosed are apparatus and methods for inspecting a semiconductor sample. Locations corresponding to candidate defect events on a semiconductor sample are provided from an optical inspector operable to acquire optical images from which such candidate defect events are detected at their corresponding locations across the sample. High-resolution images are acquired from a high-resolution inspector of the candidate defect events at their corresponding locations on the sample. Each of a set of modelled optical images, which have been modeled from a set of the acquired high-resolution images, is correlated with corresponding ones of a set of the acquired optical images, to identify surface noise events, as shown in the set of high-resolution images, as sources for the corresponding candidate events in the set of acquired optical images. Otherwise, a subsurface event is identified as a likely source for a corresponding candidate defect event.

18 Claims, 5 Drawing Sheets

(51) Int. Cl.
*G06T 7/00* (2017.01)
*G06T 7/174* (2017.01)
*G06T 7/11* (2017.01)
*G01N 23/2251* (2018.01)
*G01N 21/956* (2006.01)

(52) U.S. Cl.
CPC .............. *G06T 7/001* (2013.01); *G06T 7/11* (2017.01); *G06T 7/174* (2017.01); *G01N 2021/95615* (2013.01); *G06T 2207/10061* (2013.01); *G06T 2207/20081* (2013.01); *G06T 2207/30148* (2013.01)

(58) Field of Classification Search
CPC .......... G01N 2207/10061; G01N 2207/20081; G01N 2207/30148; G06T 7/11; G06T 7/174; G06T 7/011
See application file for complete search history.

(56) References Cited

U.S. PATENT DOCUMENTS

| | | |
|---|---|---|
| 2015/0125065 A1 | 5/2015 | Lee et al. |
| 2017/0140524 A1 | 5/2017 | Karsenti et al. |

CORRELATING SEM AND OPTICAL IMAGES FOR WAFER NOISE NUISANCE IDENTIFICATION

CROSS-REFERENCE TO RELATED APPLICATIONS

This application claims the benefit of prior U.S. Provisional Application No. 62/687,192, filed 19 Jun. 2018 by Qiang Zhang et al., which application is herein incorporated by reference in its entirety for all purposes.

TECHNICAL FIELD OF THE INVENTION

The invention generally relates to the field of wafer inspection systems. More particularly the present invention relates to defect detection using both optical and scanning electron microscope (SEM) images or the like.

BACKGROUND

Generally, the industry of semiconductor manufacturing involves highly complex techniques for fabricating integrated circuits using semiconductor materials which are layered and patterned onto a substrate, such as silicon. Due to the large scale of circuit integration and the decreasing size of semiconductor devices, the fabricated devices have become increasingly sensitive to defects. That is, defects which cause faults in the device are becoming increasingly smaller. The device needs to be generally fault free prior to shipment to the end users or customers.

Optical inspection of patterned wafers at the deep UV (ultraviolet) wavelength has been the main inspection solution for leading-edge integrated circuit (IC) fabrication in critical defect inspection and process control. As the IC industry continues to push the wafer pattern design towards smaller design rule for higher device density and better performance, the challenges to find yield-limiting defects in the wafer inspection also increases dramatically. Among them, one of the greatest challenges lies in control of wafer noise nuisances.

Accordingly, there is a continued demand for improved semiconductor wafer inspector systems and techniques.

SUMMARY

The following presents a simplified summary of the disclosure in order to provide a basic understanding of certain embodiments of the invention. This summary is not an extensive overview of the disclosure and it does not identify key/critical elements of the invention or delineate the scope of the invention. Its sole purpose is to present some concepts disclosed herein in a simplified form as a prelude to the more detailed description that is presented later.

In one embodiment, a method of inspecting a semiconductor sample is disclosed. Locations corresponding to a plurality of candidate defect events on a semiconductor sample are provided from an optical inspector operable to acquire a plurality of acquired optical images from which such candidate defect events are detected at their corresponding locations across the sample. High-resolution images are acquired from a high-resolution inspector, such as a scanning electron microscope, operable to acquire such high-resolution images of the plurality of candidate defect events at their corresponding locations on the sample. Each of a first set of modelled optical images, which have been modeled from a first subset of the acquired high-resolution images, is correlated with corresponding ones of a first set of the acquired optical images, to identify a plurality of surface noise events, as shown in the first set of high-resolution images, as sources for the corresponding defect events in the first set of acquired optical images.

In another example embodiment, the correlating of each of the first set of modelled optical images results in identification of the surface noise events as sources if the corresponding modelled and acquired optical images are substantially identical. In this aspect, each of a second set of modelled optical images, which have been modeled from a second subset of the acquired high-resolution images, is correlated with a corresponding one of a second set of the acquired optical images so that noise events are not identified as sources and, instead, subsurface events are identified as sources for the corresponding defect events in the second set of acquired optical images.

In another implementation, each candidate event represents a surface defect event, one or more noise events, or a subsurface event present on the sample. In another aspect, prior to correlating the first and second set of modelled images with their corresponding first and second sets of acquired optical images, the high-resolution images are analyzed to classify the candidate events into ambiguous and unambiguous events. In this aspect, each high-resolution image in the first and second set of high-resolution images is associated with a classified ambiguous event, and each unambiguous event is a bridge, break, protrusion, or other known defect type, wherein the ambiguous events were unclassifiable as a known defect type.

In specific implementation, a near field (NF) model is trained to model a plurality of NF images from corresponding acquired high-resolution images. In this aspect, the NF model is trained with a set of training high-resolution images that correspond to unambiguous and classified events. The first and second sets of modeled optical images are then modeled by modeling a plurality of corresponding NF images from the first and second sets of acquired high-resolution images using the trained NF model and modeling the first and second sets of modeled optical images from the corresponding NF images using an optical tool model for the optical inspector. In a further aspect, the NF model is configured to simulate light reflected and scattered, with a plurality of light characteristic parameters, from a wafer pattern, having a set of pattern characteristic parameters, that is represented in the corresponding high-resolution images, wherein the NF model is trained by (i) inputting the training high-resolution images into the NF model to model corresponding training NF images based on the light and pattern characteristic metrics, (ii) inputting the training NF images that were modelled from the training high-resolution images into the optical model to model corresponding training modeled optical images, (iii) correlating the training modeled optical images with their corresponding acquired optical images, and (iv) adjusting the light and pattern characteristic parameters and repeating the operations for inputting the training high-resolution images into the NF model, inputting the training NF images into the optical model, and correlating the training modeled optical images until such correlating operation results in a maximum correlation between the training modeled optical images and their corresponding acquired optical images.

In another aspect, modeling the first and second sets of modeled optical images is performed with respect to the first and second set of high-resolution images after they have been smoothed to remove noise introduced by the high-resolution inspector and have been binarized by a normalization process, and the correlating of each of the first and second set of modelled optical images with corresponding acquired optical images is performed after such first and second modeled optical images are down-sampled so that their resolution and/or size are the same as a resolution and size of the corresponding acquired optical images. In yet another aspect, each modelled optical image is shifted with respect to its corresponding acquired image by an offset that is determined by aligning one of the training modeled optical images with a corresponding one of the acquired images, and the shifting results in one or more noise events in a high-resolution image from the first set of high-resolution images being accurately correlated with a corresponding candidate event in the corresponding acquired optical image. In another embodiment, after correlating the first and second set of modelled images, it is determined whether the sample is to be processed further with or without repair or discarded based on review of the high-resolution images, the classified unambiguous events, and the identified noise and subsurface events if any.

In an alternative embodiment, the invention pertains to a high-resolution inspector system for inspecting a semiconductor sample. This system includes at least one processor and memory that are operable for performing any combination of the above-described operations.

These and other aspects of the invention are described further below with reference to the figures.

DETAILED DESCRIPTION OF EXAMPLE EMBODIMENTS

In the following description, numerous specific details are set forth in order to provide a thorough understanding of the present invention. The present invention may be practiced without some of these specific details. In other instances, well known process operations have not been described in detail to not unnecessarily obscure the present invention. While the invention will be described in conjunction with the specific embodiments, it will be understood that it is not intended to limit the invention to the embodiments.

Wafer noise events are real random imperfections on the wafer that arise from minor wafer process variation, which may include surface or subsurface line-edge roughness, pattern edge displacement, film thickness variation, surface roughness, pattern CD variation, etc. Most of the wafer noise artifacts have no yield impact and, accordingly, are not counted as real yield-impacting defects. However, certain noise artifacts can cause optical scattering and contribute to the optical noise in an optical inspection image. Additionally, because of the limited optical resolution of the inspection tool, the wafer noise distributed within the optical point spread function can be integrated by the imaging system and form a single merged optically salient signature in the optical image. When using an aggressive detection threshold to catch small defects in advanced nodes, statistically speaking, there is a significant risk that some distributed noise sources in a local wafer area could add up constructively in phase to get a boost in optical intensity and become strong enough to be detected as a candidate defect. In certain cases, the number of such wafer noise nuisances can be significant, as compared to the number of real defects on the wafer.

Scanning Electron Microscope (SEM) review has been relied upon to differentiate nuisance from real defect because of the SEM tool's superior resolution with respect to the optical inspection tool. However, an SEM tool is only effective in imaging wafer patterns and defects at the surface. Unlike the optical inspection tool, the SEM has a rather limited visibility of sub-surface defects due to the typically short electron mean free path. As a result, the operator of the SEM tool can often get confused about a candidate defect event that is captured by the optical tool, but not easily identifiable via an SEM (so-called SEM-Non-Visual (SNV) event). The operator is then unsure about whether the captured event is an important previous process layer defect or simply wafer noise events.

Figure 1:
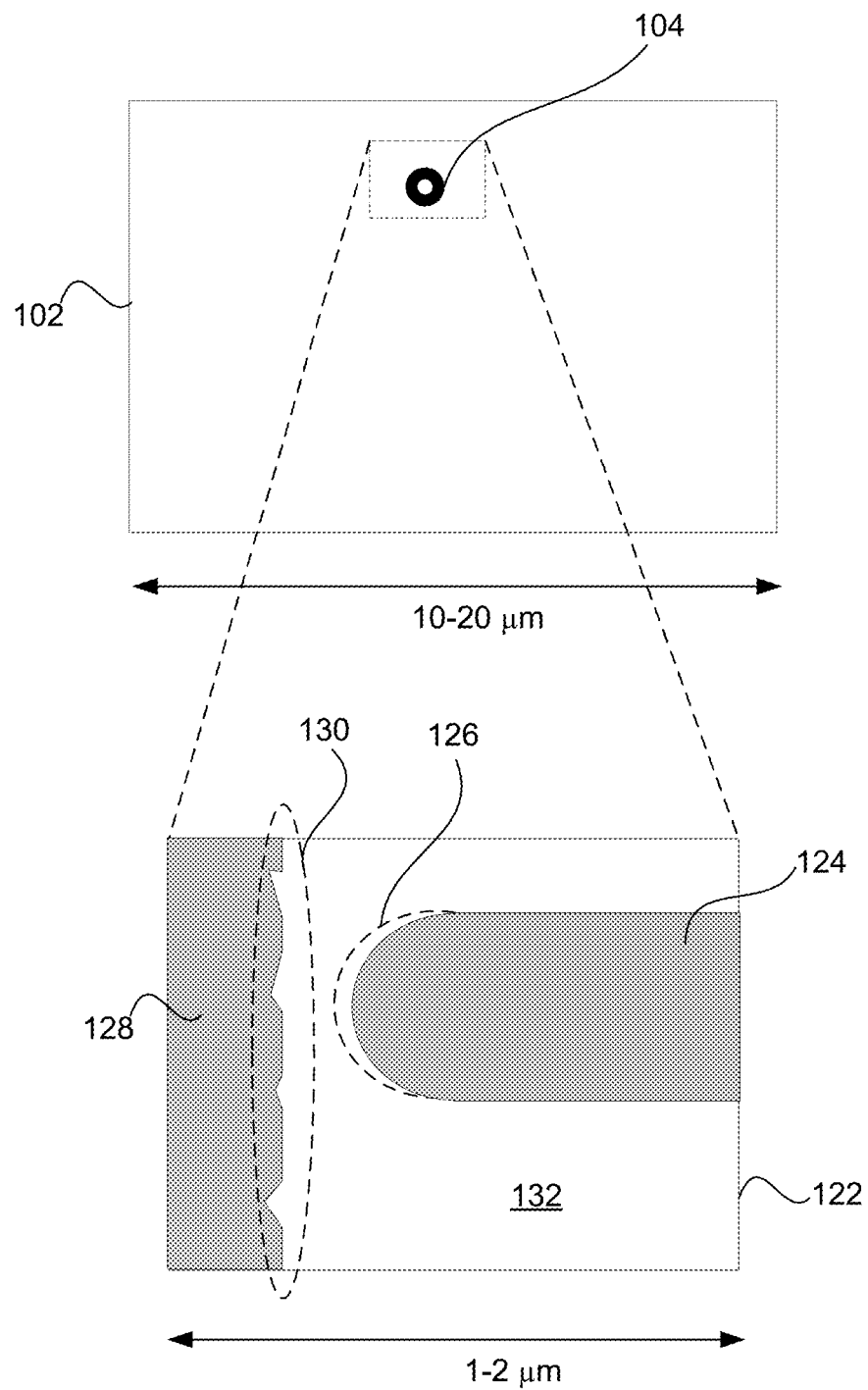
FIG. 1 is a diagrammatic representation of a captured candidate defect event from an optical image and its corresponding SEM image at the defect event site.

FIG. 1 is a diagrammatic representation of a candidate defect event 104 as captured in an optical image 102 and its corresponding SEM image 122 of the same defect event site. For example, the optical image 102 corresponds to a 10-20 m field of view (FOV), while the SEM image 122 corresponds to a 1-2 m FOV. Although a relatively large defect 104 is present in the optical image 102, it is difficult to determine the source of such defect in the corresponding SEM image 122. For example, the defect event 104 may be formed from multiple noise sources within the optical tool's point spread function (PSF) and not distinguishable from each other in the optical image 102. For example, two noise sources, including edge roughness 130 and edge displacement 126, as shown in the SEM image 122, may be found in a local pattern area with size comparable or smaller than the optical tool's PSF. Coincidentally, these two noise sources are optically integrated into a single defect event 104 in the optical image 102. However, a defect classification or review process may not be able to readily identify these minor noise discrepancies 126 and 130 in the SEM image 122 as the root cause of the defect event 104 in the optical image 102.

Certain embodiments described herein provide quantitative and effective methods and systems to correlate a high-resolution (e.g., SEM) image's wafer noise information (e.g., noise events at the wafer surface) with a corresponding optical image's captured defect event that the SEM image does not show as a clearly identifiable defect (e.g., an SNV event). This correlation may be performed by comparing an optical image that has been modeled from an SEM image with a corresponding acquired optical image. This correlation allows one to unambiguously identify certain surface noise events in the SEM image as sources for the corresponding defect event of the optical image. Conversely, if a correlation between the modelled and acquired optical images does not result in identification of noise events as sources for a corresponding defect event, one can then determine that a subsurface event is present. The inspection mechanisms described herein allow a tool operator or auto-classification process to unambiguously identify whether a candidate event is due to a defect, surface noise events, or a subsurface defect/noise event. Therefore, the correct defect management process can then be initiated for the wafer and/or subsequent wafers.

Example embodiments described herein sometimes refer to an image, such as an optical (acquired or simulated) image or a high-resolution image. The term "image" may reference an image acquired directly from the sample, e.g., wafer, a processed or modelled image, or a difference image that is obtained by subtracting reference and test/target images from each other. Each reference image is generally a defect-free version of the corresponding test image, and each reference image is nominally identical to its corresponding test image when such test image is defect-free. Any of the processes described herein may be implemented with respect to any of these types of images or any other suitable type of optical and high-resolution images.

Figure 2:
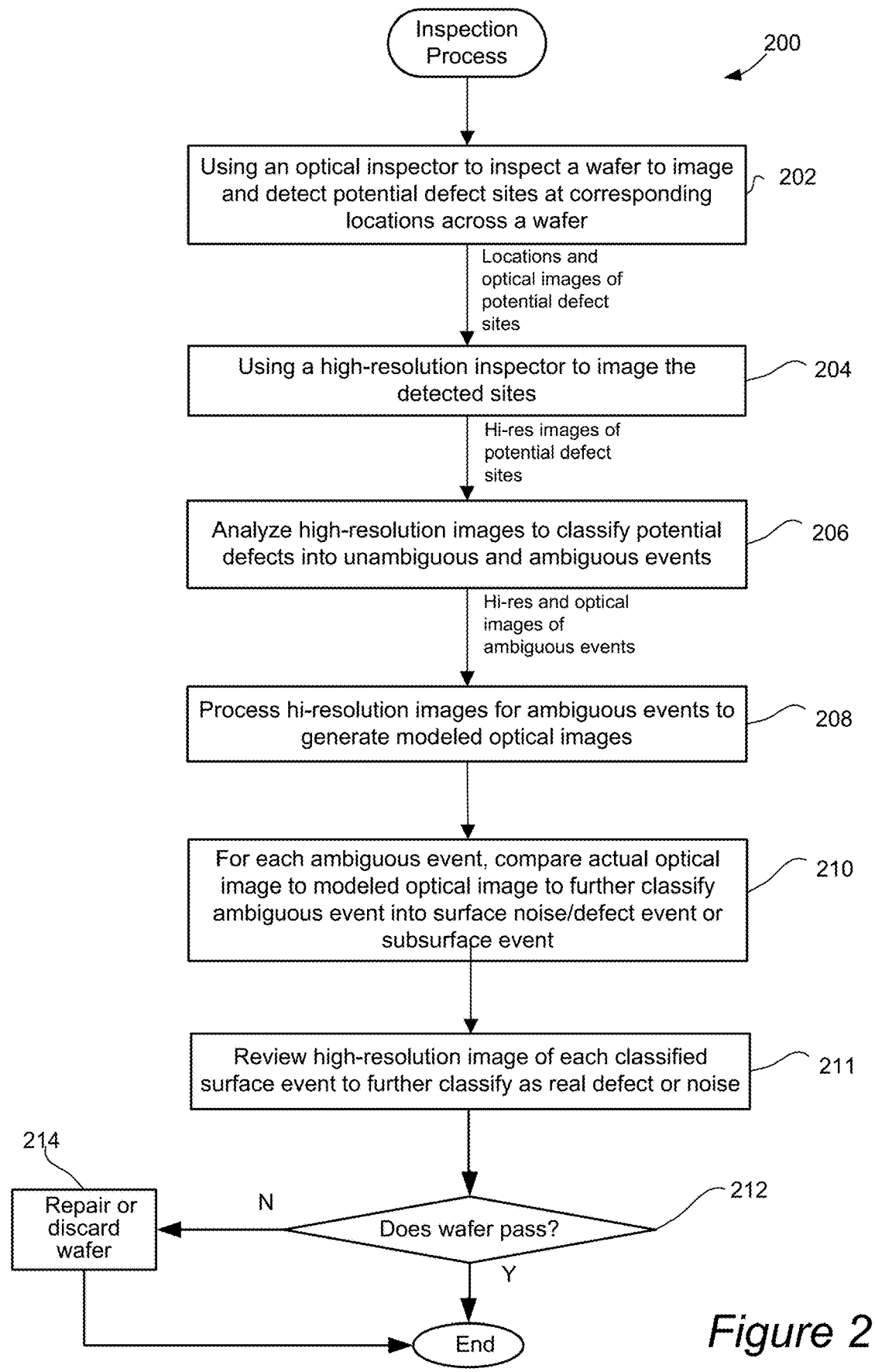
FIG. 2 is a flowchart illustrating an inspection process in accordance with one embodiment of the present invention.

FIG. 2 is a flowchart illustrating an inspection process 200 in accordance with one embodiment of the present invention. Initially, an optical inspector may be used to image and detect potential defect sites at corresponding locations on a wafer in operation 202. In general, the optical inspector acquires optical images of a wafer (or any suitable sample), compares test and reference optical images to locate differences, and determine whether such differences correspond to candidate defects. Difference events that are above a predetermined threshold may be defined as candidate defects, and a corresponding optical image of such candidate event and its location are then provided by the optical tool. Each optical test image and its corresponding optical reference image may be in the form of two identically-designed dies or die portions, cells or cell portions, etc.

The candidate defect sites may include actual defects, nuisances, and sub-surface events. In general, the optical inspector may be operable to acquire and provide candidate event locations to a high-resolution inspector for further review and analysis. The optical images and locations may be provided directly to the high-resolution inspector or made available in a separate image database that is accessible by the high-resolution inspector.

Next, a high-resolution inspector may be used to image the detected sites in operation 204. That is, a high-resolution inspector captures/acquires a set of high-resolution images of the potential defect sites. The high-resolution inspector generally captures images corresponding to a field of view (FOV) that is large enough to contain a wafer area that fits within the optical tool's point spread function (PSF), and these high-resolution images will show the actual pattern shapes and noise present in the imaged wafer area. The high-resolution inspector may take any suitable form, such as a scanning electron microscope (SEM), Helium ion microscope, atomic force microscope, etc. Embodiments described herein may refer to use of an SEM although any other suitable high-resolution inspector is also contemplated.

The acquired high-resolution images may then be analyzed to classify the potential defects into unambiguous and ambiguous events in operation 206. The unambiguous events may include bridges, breaks, protrusions, intrusions, CD defects, missing patterns, particles, etc. In general, the high-resolution images may be analyzed by using any suitable classification process, such as a die-to-die, cell-to-cell, die-to-database inspection, etc. A neural network, algorithm/model, or other learning algorithm may be used for learning defect and/or nuisance classifications. Other approaches that use complex computational methods for noise-free reference generation can also be used as the detection algorithm for the high-resolution images. In addition, a detection algorithm that leverages the semiconductor device design file can also be used for classifying events in the high-resolution images.

Classification techniques may include thresholding events that have sizes above a predefined threshold as defects. An auto-classification process may also be trained to recognize certain classes of defects, such as bridges, breaks, protrusions, intrusions, CD defects, missing pattern, and particles, based on training images that include such defect types. Additionally, knowledge of the design may be used to determine that a bridge is not intended to be present between two design features. The remaining candidate defects, which cannot be classified into unambiguous events, may then be classified as ambiguous events, which are analyzed further as described herein.

The high-resolution images for the ambiguous events may then be processed to generate modeled optical images in operation 208. In one embodiment, one or more models are used to model an accurate optical image from each SEM image. As further described herein the modeling includes a training process for modeling the near field (NF) optical image from the SEM image, as well as an optical tool model for modeling the final optical image from the NF optical image.

For each ambiguous event, the actual optical image (from the optical inspector) may then be compared to its corresponding modeled optical image to further classify each ambiguous event into surface noise (or defect) events or subsurface event in operation 210. If the modeled optical image shows a significantly different signature from the acquired optical images at the candidate defect location, it may be determined that the candidate event is a subsurface event since the SEM cannot image subsurface events. A subsurface event may be in the form of a defect or noise in an underlying layer. If the modeled and acquired images are the substantially identical (e.g., having a difference that is less than a predetermined amount of percentage), the candidate event may be flagged as a surface defect or surface noise.

Determining whether to classify a candidate defect as surface or subsurface events may be accomplished, for example, by measuring and comparing the signal-to-noise ratio (SNR) in both the difference acquired image and difference modeled image. In one embodiment, the SNR is calculated by the ratio of the signal intensity at the candidate defect location against the RMS noise intensity in the surrounding area. If both images have SNR values above a predetermined threshold (for example ~3) and a similar signal polarity, the candidate event can be classified as surface noise. If the SNR in the acquired optical image is above the threshold while the SNR in the modelled image is significantly below the threshold, the candidate event can be classified as a subsurface defect.

A high-resolution image of each classified surface event may then be reviewed to further classify such event as a "real" defect or noise in operation 211. When the modeled and captured optical images are identical or substantially identical, one or more SEM features (and corresponding wafer features) can be identified as contributing to the candidate defect in either optical image. As further described herein, processing the SEM images to simulate optical images involves determining an offset for aligning the images. This offset can also be used to locate the contributing sources in the SEM image, which can then be reviewed to verify if a candidate event is a real defect or noise/roughness. Thus, one can correlate a location of one or more feature(s) that cause an optical issue. The correlation results help an operator to be more certain (and not guess) about source event location(s) for each candidate event. An operator or an automated process, such as an autoclassification process, may be used to make this final classification. A real defect will likely impact yield or device function. In contrast, a nuisance type defect will not impact yield or device function. For instance, if a candidate defective event shows no clear indication of the presence of an unambiguous defect in its high-resolution image, but its difference acquired optical image can be faithfully reproduced in the difference modeled optical image with a similar magnitude, position and shape, it may be verified that the candidate event is indeed a wafer noise nuisance. Otherwise, there is a good possibility the candidate event is attributed to a sub-surface defect.

After the candidate events are classified and reviewed, it may then be determined whether the wafer passes in operation 212. If the wafer passes, the inspection process may end. The wafer sample may then be further processed, diced, and formed into packaged devices/systems. If the wafer includes yield-affecting defects, it may be determined that the wafer does not pass inspection. Otherwise, if the wafer does not pass, the wafer may be repaired (if possible) or discarded if repair is not possible in operation 214, after which the inspection process for the current wafer ends. For repairing the wafer, certain materials/structures may be removed or added to the wafer to eliminate the adverse effects of certain defects. The repaired wafer may then be further processed, diced, and formed into packaged devices/systems. Repair of the wafer may also include removal of defective dies from the dies that are diced and packaged into devices/systems. Additionally, or alternatively, the process for fabricating a wafer may be adjusted to eliminate defects from occurring on subsequent wafers.

Figure 3:
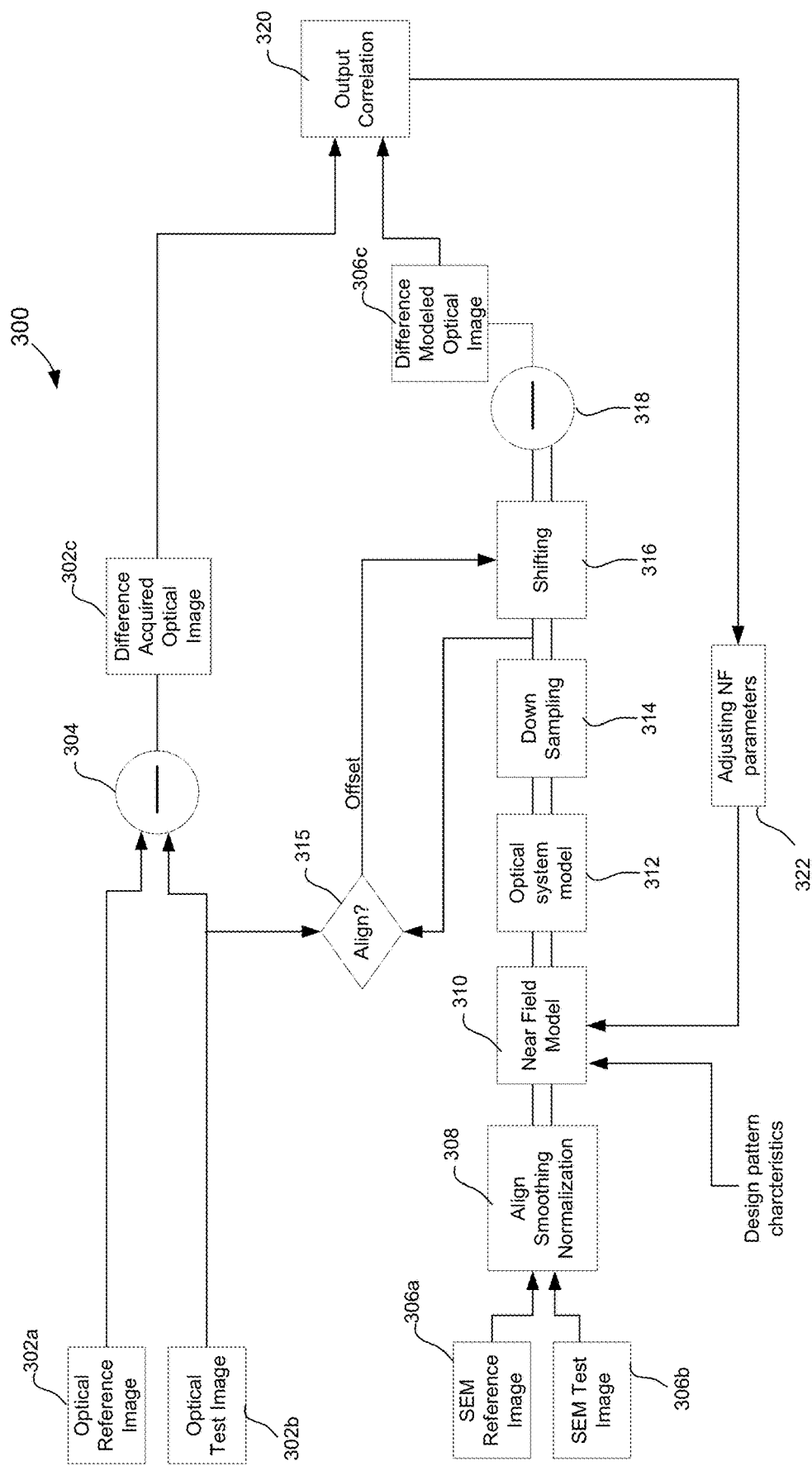
FIG. 3 is a diagrammatic representation of a detailed learning and correlation process for generating modeled optical images from SEM images in accordance with a specific implementation of the present embodiment.

FIG. 3 is a diagrammatic representation of a detailed learning and correlation process 300 for generating modeled optical images in accordance with a specific implementation of the present embodiment. Initially, an optical reference image 302a and optical test image 302b may be input into the training process. Likewise, an SEM reference image 306a and an SEM test image 306b are input into the training and correlation process. In general, each test image corresponds to an area of the wafer that is being inspected for defects, while each corresponding reference image is an image corresponding to a wafer area that is identical to its corresponding test image when such test image is defect-free. The reference image may be generated by imaging an area of the wafer that is designed to be identical to the area of the wafer for the corresponding test area.

In general, a small set of optical and corresponding SEM images, e.g., five, of the potential defect sites are used in the training process. The training images may include unambiguous images having sites that have been classified as unambiguous defect or noise events, such as bridges, breaks, or other known defect or noise types, etc. Any suitable number of images may be used to train an accurate model for generating the modeled optical images from the SEM images. Suitable numbers may include at least 5, 5-10, 10-20, 20-50, or 50-100, depending on factors such as image sizes, number of model parameters, etc.

Each set of acquired optical reference and test images 302a and 302b may be subtracted (304) to generate a difference acquired optical image 302c. Of course, these optical images are first aligned before subtraction. The resulting difference optical image corresponds to a potential defect or nuisance site generated from the optical inspection.

In the illustrated example, the SEM reference and test images 306a and 306b are first input into an align, smoothing, and normalizing process 308. The alignment operation (for each set of optical and SEM reference and test images) may include alignment based on any suitable technique, such as moving the reference and test with respect to each other until an optimized match is accomplished. Before this process, alignment marks on the wafer may be used to coarsely align the images with respect to each other.

Since SEM images are captured with extremely high resolution, e.g., 1 nm, the SEM images already provide a best representation of the actual wafer patterns. However, the SEM images will typically have additional artifacts introduced by the SEM. Smoothing for the SEM images may include removal of noise introduced by the SEM. That is, the images may be filtered to remove known shot noise and intensity fluctuations that are known to occur when imaging with the particular SEM tool that is being used to image the wafer.

Normalization generally includes normalizing the grayscale of both the reference and test images. For instance, the SEM images may be binarized to result in pattern contours in the images, like the SEM image 122 of FIG. 1. That is, the design structures (e.g., 124 and 128) may be assigned a "1" value, while the surrounding field regions (e.g., 132) may be given a "0" value or vice versa.

After processing the SEM images, modeling may then be applied to the resulting SEM images, which best represent the actual wafer area, to obtain accurate optical images of the wafer images, except for the underlying features which are not imaged by the SEM. First, the SEM images, along with known pattern characteristics, may be fed into a near field model 310 that models SEM near field images from the input. The known pattern characteristics, which are typically provided with the wafer being inspected, may include material composition of the scanned wafer layer, including material composition that is present within and outside the pattern contours of the processed SEM images. For example, the known compositions of the inspected layer may specify a copper material for the patterns (e.g., 124 and 128 of FIG. 1) and oxide for the field regions (e.g., 132) of the SEM image (e.g., 122). The known characteristics for the imaged wafer portion may also include known or approximated compositions, topography, and thicknesses of surface and underlying layers and patterns.

The NF model starts with the smoothed and normalized SEM images, which represent the actual wafer pattern, and simulates light reflecting from the different materials of the different portions at the surface of the wafer pattern as represented in the processed SEM images. That is, the near field modeling simulates light reflected from specified layer material within and outside the pattern contours as represented in the corresponding SEM image to then simulate an NF image near the surface of the wafer pattern as represented by the processed SEM image. The near field images are simulated at a point proximate to the sample and prior to the reflected light passing through the optical tool's imaging path onto the detector. Any suitable NF model may be used, such as a Kirchhoff model, which includes parameters that can be calibrated in order to give the best match between the final rendered and acquired optical.

The resulting near field image may then be input to an optical system model 312 that models the light on the detector of the optical tool after it passes through the optics. In example embodiments, the optical system model may comprise one of more of the following elements: a partial coherent model (PCM) to model a partial coherent imaging system, a source spectral model to model an incoherent source with finite bandwidth, a polarization model to model different optical polarization states, etc. In general, the optical system model uses parameters and characteristics of the optical tool being used to collect actual optical images in this embodiment. Any suitable parameters and characteristics that have values or settings that affect the optical electromagnetic waves from the NF image through the collection path and onto the detector may be used. By way of examples, these parameters may include metrics for wavelength, focus, numerical aperture (NA), shape of illumination and imaging apertures, and aberrations present in the optical tool.

These parameters are input into the optical model to transform the NF image into an optical intensity image, which is what would be imaged by the optical tool starting with the NF image. That is, the high-resolution SEM images are translated into more accurate optical images that can be then directly compared to the corresponding acquired optical images.

However, optical images that have an optimal accuracy are obtained by training the NF model (the optical model is already well-known and does not require training). The training, which uses only a finite number of SEM and optical images, may be performed once to finalize the NF model. After such training, additional SEM images may then be transformed into final optical images without any further training.

Returning to the training example of FIG. 3, the training continues by inputting the optical images that are output from the optical system model 312 to a down-sampling process 314. This process 314 is operable to change the resolution and size of the modeled optical images into a same resolution and size as the optical tool. For example, the resolution of the modelled optical images is changed from 1 nm, which is the pixel size of the high-resolution SEM tool, to the optical tool's pixel size of 50 nm. In one implementation, the down-sampling process 314 may remove a certain distribution of pixels across the modeled optical images.

A down-sampled optical image, along with its corresponding acquired optical image, may then be fed into an alignment process 315. In the illustrated example, a test modeled optical image and its corresponding test acquired optical image are aligned with each other. Alternatively, a reference modeled image and its corresponding reference acquired optical image may be aligned. Alternatively, a difference modeled and acquired image may be aligned to determine an offset. However, since the test images include the potential defect site, the test images are preferably used. Any suitable alignment process may be implemented. For instance, the images may be shifted with respect to each other until there is a maximum match. The resulting offset may then be fed into a shifting process 316 for shifting the modeled optical images so they align with the acquired optical image. Alternatively, but less preferably, the shifting process may be performed on the acquired optical images.

In general, when a candidate defect is found in an actual optical image, the position ($X_0$, $Y_0$) of such candidate defect is provided for locating such candidate defect on the SEM tool. That is, the optical tool records the position of each candidate defect, and the SEM tool is ideally operable to center (with or without the operator's help) on such provided position. However, due to the stage positioning accuracy limitation of the optical tool and/or the SEM tool, the defect positioning ($X_0$, $Y_0$) accuracy may be subpar. For instance, the position error for positioning the candidate defect on the SEM tool can be as high as 500 nm-1 um. Additionally, since some defect locations can be clear in the optical image, but not in the SEM image, it may be difficult to determine which portion of the SEM image corresponds to the optical defect. Certain embodiments of the present invention allow identification of the defect source location(s) in the SEM image by modeling a corresponding optical image, which is then aligned with the captured optical image to provide a shift error. This shift error (or offset) can then be used to locate the correct candidate defect position in the corresponding SEM image.

After an offset has been determined and a shift occurs, the test and reference modeled optical images may then be subtracted (318) to form a difference modeled optical image 306c. The other training SEM images and their corresponding acquired optical images can also be similarly processed to achieve correlation results for the entire set of training images. If the correlation results are not optimized, an NF parameters adjustment process 322 alters the NF parameters. The modeling operations are repeated for the set of training SEM images to form a new set of modeled optical images. The NF parameters continue to be adjusted until the modeled optical images are optimally correlated with the acquired optical images. Optimum correlation may be defined in any suitable manner. For example, an image intensity correlation with $R^2$>90% can be defined as optimum after the calibration. Other optimum correlation specifications may include RMS value of the difference between modeled optical image and acquired optical image, etc.

The resulting final NF parameters may then be used for processing the entire set of SEM images having ambiguous events. Each difference modeled optical image 306c, along with the corresponding difference acquired optical image 302c may be input to an output correlation process 320. Additionally, each resulting difference modeled optical image may then be correlated with its corresponding difference acquired optical image to further classify the ambiguous events into surface noise, a surface defect, or a subsurface event (e.g., 210).

Any suitable optical inspection tool may be implemented for detecting and imaging candidate events as described herein. Certain inspector tool embodiments provide flexible wavelength selection in order to cover a vast range of wafer material properties and structures. Additionally, the inspection tool may be operable to provide shorter wavelengths and may include flexible polarization selection in order to obtain the best signal. The inspection system may also be operable to collect different forms of information in one scan to improve the inspection throughput, defect classification, nuisance suppression.

In general, applicable optical inspection tools for implementation of techniques of the present invention may include at least one light source for generating an incident light beam at selected wavelengths to detect defects in different material types and structure types. Such an inspection may also include illumination optics for directing the incident beam to the area-of-interest, collection optics for directing an output beam that is emitted from the area-of-interest in response to the incident beam, a sensor for detecting an output beam and generating an image or signal from the detected output beam, and a controller for controlling the components of the inspection tool and facilitating defect detection. Example tools include the 2930, 2935, and 3900 inspection system available from KLA Corp. of Milpitas, Calif.

In one embodiment, an inspection tool includes illumination and collection modules for generating and collecting light at a wide range of wavelengths (above 190 nm-950 nm). The inspector tool may also provide polarization options for parallel and perpendicular e-field and a set of sub-band wavelength filters for applying across the wavelength range for each of the long and short wavelength paths.

Figure 4:
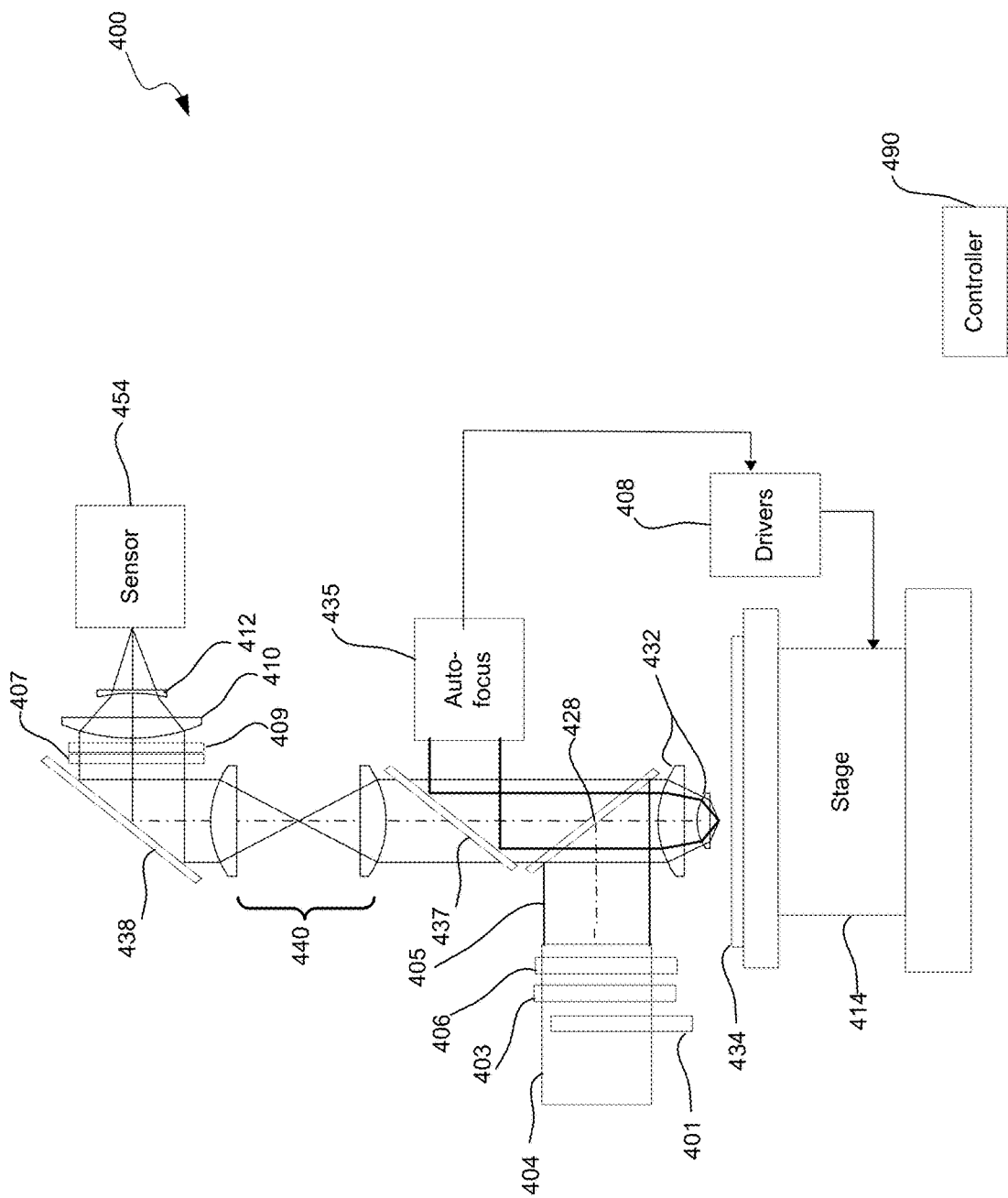
FIG. 4 is a diagrammatic representation of an optical inspection system in accordance with a specific implementation of the present invention

FIG. 4 is a diagrammatic representation of an optical inspection system 400 in accordance with a specific implementation of the present invention. As shown, the system 400 may include a broadband light source (e.g., illuminator 404) which generates illumination light 405. Examples of light sources include a laser-driven light source, a high-power plasma light source, a transillumination light source (e.g., halogen or Xe lamp), a filtered lamp, LED light sources, etc. The inspection system may include any suitable number and type of additional light sources, besides broadband light sources.

The incident beam from the light source may generally pass through any number and type of lenses which serve to relay (e.g., shape, focus or adjust focus offset, filter/select wavelengths, filter/select polarization states, resize, magnify, reduce distortion, etc.) the beam towards a sample 434.

The illuminator 404 may include any suitable optical elements for generating an incident beam having selected wavelength ranges. For example, the illuminator 404 may include a filter wheel 401 with selectable bandpass filters that are individually inserted (or rotated) into the illumination path to change the wavelength of the illumination beam. Generally, each inspection wavelength range may be selected based on optimization of its illumination and collection pupil aperture shapes, polarization of the incident and collection path, magnification, pixel size, or any combination thereof.

The illuminator may also include one or more additional spectral filters (e.g., 403) that may be used to further define the spectrum of the incident beam. For example, each spectral filter can further be used to optimize the sensitivity for the defects that are intended to be captured. A separate polarizing filter 406 can also be selectively positioned in the incident beam path to further optimize the inspection sensitivity for different wavelength ranges.

A pupil relay (not shown) may also be used to reimage the incident light and focus the pupil onto the system pupil at the objective lens 432. A 50-50 beam splitter 428 may be used to send the light to the objective lens 432. The 50-50 beam splitter 428 may also be arranged to send light reflected or scattered from the sample toward collection optics. A pupil that is conjugate to the system pupil (located at the objective lens) may be used in the incident beam path. Each pupil or aperture can have a specific shape to obscure parts of the light path to maximize the signal for the selected wavelength range.

The objective lens 432 is preferably optimized for all selectable wavelengths that are used for defect detection. For instance, the objective 432 has a composition, including lens coatings, and arrangement for correction of color aberration. In an alternative embodiment, the objective lens 432 may be an all reflective objective or refractive or a combination (catadioptric) configuration.

The resulting output beam reflected or scattered from the sample may then be received by another dichroic beam splitter 437, which may be arranged to insert an autofocus into the objective lens 432 via auto-focus system 435. The autofocus beam may have a wavelength that is separated from the different inspection bands. The wavelength for the autofocus can be varied as long as it is not in the inspection wavebands for any of the selected inspection wavelength ranges. Cost and availability of components can affect where the auto-focus insertion is located. The autofocus wavelength band may be 40 nm or less to minimize focus plane change due to wafer material response. For instance, the auto-focus system 435 may use an LED light source. The dichroic beam splitter 437 may be arranged to reflect the autofocus waveband and transmit all light above and below that region. The 50-50 beam splitter 428 can also be configured to pass the autofocus light with high efficiency (e.g., by use of a coating). This element may improve the light efficiency of the auto-focus by nearly 4×.

If the autofocus wavelength is much higher than the selectable inspection wavelength ranges, the autofocus beam will be affected by different thermally induced focus change than the inspection imaging system. The system may include mechanisms to provide feedback on the focus change due to environment (temperature, pressure), lens heating, etc. By way of examples, they auto-focus system 435 may include feedback mechanisms in the form of temperature and pressure sensors and a calibration wafer installed on the side of the wafer chuck for evaluating the focal plane change. Based on feedback, the auto-focus system 435 may adjust one or more of the lens elements (such as by moving lenses to form an adjustable air gap) to introduce focus correction or may adjust the stage (and sample 434 thereon) z position via one or more drivers 408. The frequency of the correction can also be determined based on such feedback.

The system 400 may operate in any scanning mode known in the art. For example, the system 400 may operate in a swathing mode when the illumination beam scans across the surface of the sample 434. In this regard, the system 400 may scan an illumination beam across the sample 434, while the sample is moving, with the direction of scanning being nominally perpendicular to the direction of the sample motion.

The output beam may be directed and shaped by any suitable number and type of collection optics, such as pupil relay (lens group 440) and, mirror 438, a polarizer 407, aperture 409, and optics elements 410 and 412 for zooming and focusing the output beam onto sensor 454. By way of example, the sensor 454 may be in the form of a CCD (charge coupled device) or TDI (time delay integration) detector, photomultiplier tube (PMT), or other sensor.

The pupil relay 440 may be designed to form an image of the system pupil (at the objective lens 432) for the purpose of inserting specific apertures (409) in the collection path to optimize the inspection sensitivity for each wavelength range. Different aperture settings may be selected to achieve different angles of incidence on the sample. A polarizing filter (405 or 407) may be positioned in the illumination or collection path for the purpose of also optimizing the inspection sensitivity.

The sample 434 may be disposed on sample stage 414 configured to support the sample 434 during scanning. In some embodiments, the sample stage 414 is an actuatable stage. For example, the sample stage 414 may include, but is not limited to, one or more translational stages suitable for selectably translating the sample 434 along one or more linear directions (e.g., x-direction, y-direction and/or z-direction). By way of another example, the sample stage 414 may include, but is not limited to, one or more rotational stages suitable for selectably rotating the sample 434 along a rotational direction. By way of another example, the sample stage 414 may include, but is not limited to, a rotational stage and a translational stage suitable for selectably translating the sample along a linear direction and/or rotating the sample 434 along a rotational direction.

The system may also include a controller or computer system (e.g., 490). For instance, the signals captured by each detector can be processed by controller 490, which may include a signal processing device having an analog-todigital converter configured to convert analog signals from each sensor into digital signals for processing. The controller may be configured to analyze intensity, images, phase, and/or other characteristics of the sensed light beam. The controller may be configured (e.g., with programming instructions) to provide a user interface (e.g., on a computer screen) for displaying resultant test images and other inspection characteristics as described further herein. The controller may also include one or more input devices (e.g., a keyboard, mouse, joystick) for providing user input, such as changing wavelength, polarization, or aperture configuration, viewing detection results data or images, setting up an inspection tool recipe.

Techniques of the present invention may be implemented in any suitable combination of hardware and/or software, such as controller 490. The controller typically has one or more processors coupled to input/output ports, and one or more memories via appropriate buses or other communication mechanisms.

The controller may be generally configured to control various components of the inspection system. For instance, the controller may control selective activation of the illumination source, the illumination or output aperture settings, wavelength band, focus offset setting, polarization settings, stage and beam steering, etc. The controller may also be configured to receive the image or signal generated by each detector and analyze the resulting image or signal to determine whether candidate events (defects/nuisances) are present on the sample, provide locations of candidate events, characterize defects present on the sample, or otherwise characterize the sample. For example, the controller may include a processor, memory, and other computer peripherals that are programmed to implement instructions of the method embodiments of the present invention.

Because such information and program instructions may be implemented on a specially configured computer system, such a system includes program instructions/computer code for performing various operations described herein that can be stored on a computer readable media. Examples of machine-readable media include, but are not limited to, magnetic media such as hard disks, floppy disks, and magnetic tape; optical media such as CD-ROM disks; magneto-optical media such as optical disks; and hardware devices that are specially configured to store and perform program instructions, such as read-only memory devices (ROM) and random access memory (RAM). Examples of program instructions include both machine code, such as produced by a compiler, and files containing higher level code that may be executed by the computer using an interpreter.

Figure 5:
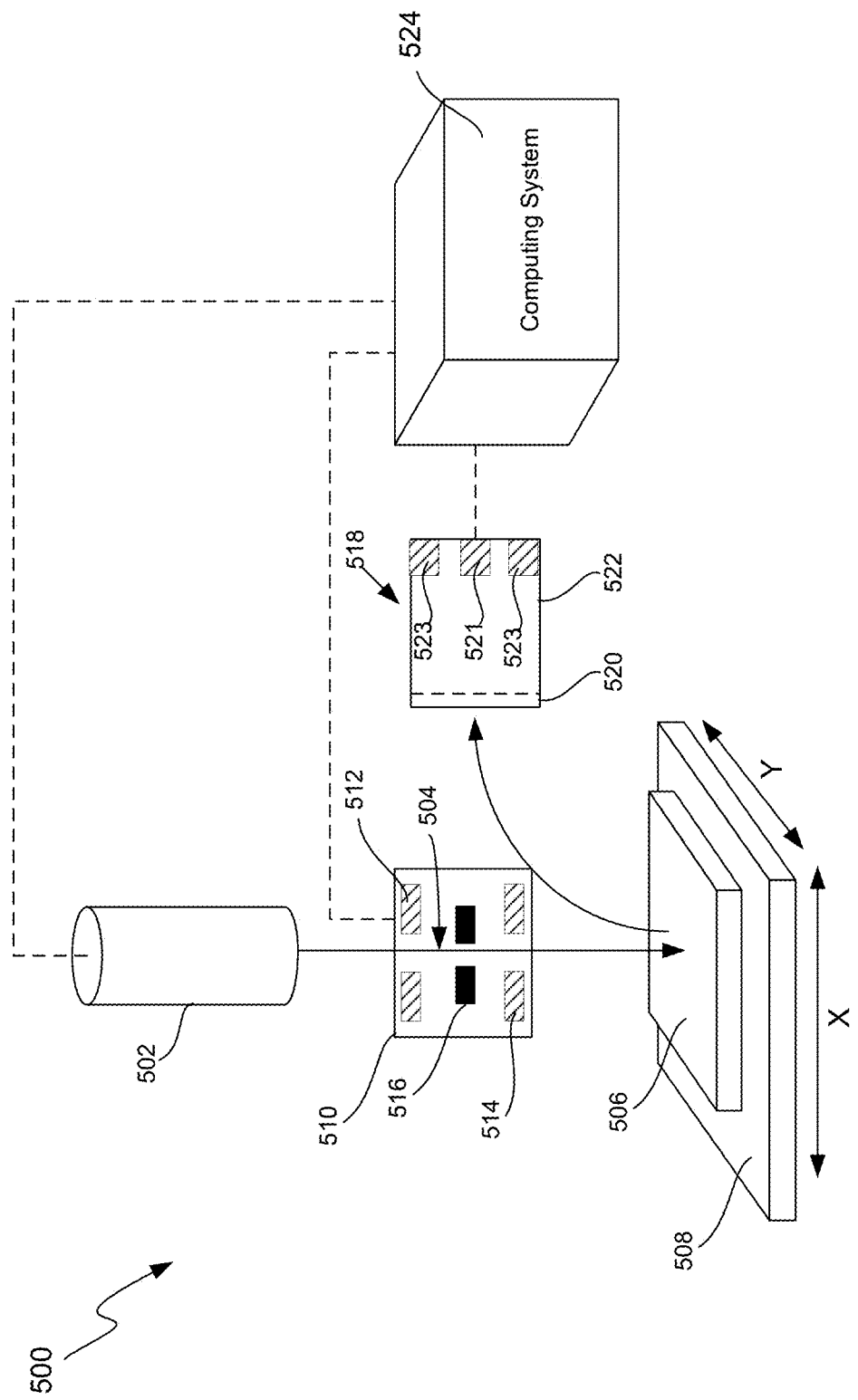
FIG. 5 is a diagrammatic representation of a scanning electron microscopy (SEM) system in accordance with one embodiment of the present invention.

Any suitable combination of hardware and/or software may be used to implement a high-resolution inspector. FIG. 5 is a diagrammatic representation of a scanning electron microscopy (SEM) system 500 in accordance with one embodiment of the present invention. The system 500 may be configured to scan each candidate event of a sample 506 such as, but not limited to, a wafer (e.g., semiconductor wafer) having two or more layers formed thereon with an electron beam 504 to capture SEM images.

The system 500 may operate in any scanning mode known in the art. For example, the system 500 may operate in a swathing mode when scanning an electron beam 504 across a candidate defect site of the sample 506. In this regard, the system 500 may scan an electron beam 504 across the sample 506, while the sample is moving, with the direction of scanning being nominally perpendicular to the direction of the sample motion. By way of another example, the system 500 may operate in a step-and-scan mode when scanning an electron beam 504 across the surface of the sample 506. In this regard, the system 500 may scan an electron beam 504 across the sample 506, which is nominally stationary when the beam 504 is being scanned.

The system 500 may include an electron beam source 502 for generating one or more electron beams 504. The electron beam source 502 may include any electron beam source known in the art. For example, the electron beam source 502 may include, but is not limited to, one or more electron guns. In some embodiments, a computing system 524 or controller may be communicatively coupled to the electron beam source 502. The computing system 524 may be configured to adjust one or more electron source parameters via a control signal to the electron beam source 502. For example, the computing system 524 may be configured to vary the beam current for the electron beam 504 emitted by source 502 via a control signal transmitted to control circuitry of the electron beam source 502.

The sample 506 may be disposed on a sample stage 508 configured to support the sample 506 during scanning. In some embodiments, the sample stage 508 is an actuatable stage. For example, the sample stage 508 may include, but is not limited to, one or more translational stages suitable for selectably translating the sample 506 along one or more linear directions (e.g., x-direction, y-direction and/or z-direction). By way of another example, the sample stage 508 may include, but is not limited to, one or more rotational stages suitable for selectably rotating the sample 506 along a rotational direction. By way of another example, the sample stage 508 may include, but is not limited to, a rotational stage and a translational stage suitable for selectably translating the sample along a linear direction and/or rotating the sample 506 along a rotational direction.

In some embodiments, the computing system 524 or controller is communicatively coupled to the sample stage 508. The computing system 524 may be configured to adjust one or more stage parameters via a control signal transmitted to the sample stage 508. The computing system 524 may be configured to vary the sample scanning speed and/or control the scan direction via a control signal transmitted to control circuitry of the sample stage 508. For example, the computing system 524 may be configured to vary the speed and/or control the direction with which sample 506 is linearly translated (e.g., x-direction or y-direction) relative to the electron beam 504. As discussed in further detail herein, the sample 506 may be scanned in a tilted orientation relative to feature placement (e.g., perpendicular or tilted otherwise with respect to a longitudinal axis of the pattern lines) of target structures forming an overlay metrology target or mark on the sample 506.

The system 500 may further include a set of electron-optic elements 510. The set of electron-optics may include any suitable elements known in the art suitable for focusing and/or directing the electron beam 504 onto a selected portion of the sample 506. In one embodiment, the set of electron-optics elements includes one or more electron-optic lenses. For example, the electron-optic lenses may include, but are not limited to, one or more condenser lenses 512 for collecting electrons from the electron beam source. By way of another example, the electron-optic lenses may include, but are not limited to, one or more objective lenses 514 for focusing the electron beam 504 onto a selected region of the sample 506. In some embodiments, the electron beam 504 may be directed to the sample 506 at a controlled angle to the sample. Because a wafer system of coordinates does not necessarily coincide with an SEM system of coordinates, controlling a fine scan angle may improve matching between the coordinate systems and significantly contribute to sampling performance/accuracy.

In some embodiments, the set of electron-optics elements includes one or more electron beam scanning elements 516. For example, the one or more electron beam scanning elements 516 may include, but are not limited to, one or more scanning coils or deflectors suitable for controlling a position of the beam relative to the surface of the sample 506. In this regard, the one or more scanning elements 516 may be utilized to scan the electron beam 504 across the sample 506 in a selected scan direction or pattern. For example, the sample 506 may be scanned in tilted or perpendicular bidirectional scans relative to feature placement (e.g., at bidirectional directions and angled with respect to target lines) of target structures forming an overlay metrology target or mark on the sample 506. The computing system 524 or controller may be communicatively coupled to one or more of the electron-optic elements 510, such as the one or more scanning elements 516. Accordingly, the computing system may be configured to adjust one or more electron-optic parameters and/or control the scan direction via a control signal transmitted to the one or more communicatively coupled electron-optic elements 510.

The system 500 may further include a detector assembly 518 configured to receive electrons 517 from the sample 506. In some embodiments, the detector assembly 518 includes an electron collector 520 (e.g., secondary electron collector). The detector assembly may further include an energy filter based, for example, on retarding field principle. In this regard, the energy filter may be configured to stop low energy secondary electrons while passing high energy secondary electrons (i.e., backscattered electrons). If the energy filter is not activated, all secondary electrons are detected according to collection efficiency of the detection system. By subtracting high energy electron image from overall electron image, low energy secondary electron image can be obtained. The detector assembly 518 may further include a detector 522 (e.g., scintillating element and PMT detector 522) for detecting electrons from the sample surface (e.g., secondary electrons). In some embodiments, the detection system 522 may include several electron detectors, such as, for example, one or more Bright Field (BF) detectors 521 and one or more Dark Field (DF) detectors 523. In some embodiments, there may be from 2 to 8 (or even more) DF detectors 523. The BF detector 521 detects electrons with low (according to wafer normal) emission angles, while DF detectors 523 provide information carried by the electrons with higher emission angles. In some embodiments, the detector 522 of the detector assembly 518 includes a light detector. For example, the anode of a PMT detector of the detector 522 may include a phosphor anode, which is energized by the cascaded electrons of the PMT detector absorbed by the anode and may subsequently emit light. In turn, the light detector may collect light emitted by the phosphor anode in order to image the sample 506. The light detector may include any light detector known in the art, such as, but not limited to, a CCD detector or a CCD-TDI detector. The system 500 may include additional/alternative detector types such as, but not limited to, Everhart-Thornley type detectors. Moreover, the embodiments described herein are applicable to single detector and multiple-detector arrangements.

In some embodiments, the computing system 524 or controller is communicatively coupled to the detector assembly 518. The computing system 524 may be configured to adjust one or more image forming parameters via a control signal transmitted to the detector assembly 518. For example, the computing system may be configured to adjust the extraction voltage or the extraction field strength for the secondary electrons. Those skilled in the art will appreciate that "the computing system 524" may include one or more computing systems or controllers, such as one or more processors configured to execute one or more instruction sets embedded in program instructions stored by at least one non-transitory signal bearing medium. The computing system 524 may control various scanning or sampling parameters such as, but not limited to, those described herein.

While the foregoing description focused on the detector assembly 518 in the context of the collection of secondary electrons, this should not be interpreted as a limitation on the present invention. It is recognized herein that the detector assembly 518 may include any device or combination of devices known in the art for characterizing a sample surface or bulk with an electron beam 504. For example, the detector assembly 518 may include any particle detector known in the art configured to collect backscattered electrons, Auger electrons, transmitted electrons or photons (e.g., x-rays emitted by surface in response to incident electrons). In some embodiments, the detected electrons are differentiated (e.g., secondary electrons vs. backscattered electrons) based upon the energy levels and/or emission angles of the detected electrons, and by subtracting high energy electron image from overall electron image, low energy secondary electron image can be obtained.

The computing system 524 may be configured to receive and/or acquire data or information (e.g., detected signals/images, statistical results, reference or calibration data, training data, models, extracted features or transformation results, transformed datasets, curve fittings, qualitative and quantitative results, etc.) to and from other systems by a transmission medium that may include wireline and/or wireless portions. In this manner, the transmission medium may serve as a data link between the computing system 524 and other systems (e.g., memory on-board metrology system, external memory, reference measurement source, or other external systems). For example, computing system 524 may be configured to receive measurement, imaging, and location data from a storage medium (e.g., internal or external memory) via a data link. For instance, results obtained using the detection system may be stored in a permanent or semi-permanent memory device (e.g., internal or external memory). In this regard, the results may be imported from on-board memory or from an external memory system. Moreover, the computing system 524 may send data to other systems via a transmission medium. For instance, qualitative and/or quantitative results (e.g., model parameters, models, classifications of candidate events, acquired and modelled images, etc.), determined by computing system 524 may be communicated and stored in an external memory. In this regard, analysis results may be exported to another system.

Computing system 524 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium. Program instructions may be stored in a computer readable medium (e.g., memory). Exemplary computer-readable media include read-only memory, a random-access memory, a magnetic or optical disk, or a magnetic tape.

In other embodiments, a SEM having a column array system may be used for capturing, processing, and analyzing high-resolution images. Several example systems are described further in U.S. patent application Ser. No. 16/272,905, entitled "ULTRA-HIGH SENSITIVITY HYBRID INSPECTION WITH FULL WAFER COVERAGE CAPABILITY", by Grace Chen et al., which application is incorporated herein by reference for all purposes. For instance, the SEM inspector includes a linear column array and a swathing continuously-moving precision stage. In one example, each probe in the linear probe array is miniaturized so the array can span the wafer. For instance, the probes can be formed from microelectromechanical system (MEMS) technology. Of course, other types of probes can be implemented.

In any of the systems and techniques described herein, computational algorithms are usually optimized for inspection or metrology applications with one or more approaches being used such as design and implementation of computational hardware, parallelization, distribution of computation, load-balancing, multi-service support, dynamic load optimization, etc. Different implementations of algorithms can be done in firmware, software, FPGA, programmable optics components, etc.

Certain embodiments of the present invention presented here generally address the field of semiconductor metrology and process control, and are not limited to the hardware, algorithm/software implementations and architectures, and use cases summarized above.

Although the foregoing invention has been described in some detail for purposes of clarity of understanding, it will be apparent that certain changes and modifications may be practiced within the scope of the appended claims. It should be noted that there are many alternative ways of implementing the processes, systems, and apparatus of the present invention. Accordingly, the present embodiments are to be considered as illustrative and not restrictive, and the invention is not to be limited to the details given herein.

What is claimed is:

1. A method of inspecting a semiconductor sample, the method comprising:
   providing a plurality of locations corresponding to a plurality of candidate defect events on a semiconductor sample from an optical inspector operable to acquire a plurality of acquired optical images from which such candidate defect events are detected at their corresponding locations across the sample;
   acquiring high-resolution images from a high-resolution inspector operable to acquire such high-resolution images of the plurality of candidate defect events at their corresponding locations on the sample;
   correlating each of a first set of modelled optical images, which have been modeled from a first subset of the acquired high-resolution images, with a corresponding one of a first set of the acquired optical images, to identify a plurality of surface noise events, as shown in the first set of high-resolution images, as sources for the corresponding candidate defect events in the first set of acquired optical images, wherein the correlating of each of the first set of modelled optical images results in identification of the surface noise events as sources if the corresponding modelled and acquired optical images are substantially identical; and
   correlating each of a second set of modelled optical images, which have been modeled from a second subset of the acquired high-resolution images, with a corresponding one of a second set of the acquired optical images so that noise events are not identified as sources and, instead, subsurface events are identified as sources for the corresponding candidate defect events in the second set of acquired optical images.

2. The method of claim 1, wherein each candidate event represents a surface defect event, one or more noise events, or a subsurface event present on the sample.

3. The method of claim 1, further comprising prior to correlating the first and second set of modelled images with their corresponding first and second sets of acquired optical images, analyzing the high-resolution images to classify the candidate events into ambiguous and unambiguous events, wherein each high-resolution image in the first and second set of high-resolution images is associated with a classified ambiguous event, wherein each unambiguous event is a bridge, break, protrusion, intrusion, or other known defect types, wherein the ambiguous events were unclassifiable as a known defect type.

4. The method of claim 3, further comprising:
   training a near field (NF) model to model a plurality of NF images from corresponding acquired high-resolution images, wherein the NF model is trained with a set of training high-resolution images and acquired optical images that correspond to unambiguous and classified events;
   modeling the first and second sets of modeled optical images by modeling a plurality of corresponding NF images from the first and second sets of acquired high-resolution images using the trained NF model and modeling the first and second sets of modeled optical images from the corresponding NF images using an optical tool model for the optical inspector.

5. The method of claim 4, wherein the NF model is configured to simulate light reflected and scattered, with a plurality of light characteristic parameters, from a wafer pattern, having a set of pattern characteristic parameters, that is represented in the corresponding high-resolution images, wherein the NF model is trained by:
   inputting the training high-resolution images into the NF model to model corresponding training NF images based on the light and pattern characteristic metrics;
   inputting the training NF images that were modelled from the training high-resolution images into the optical model to model corresponding training modeled optical images;
   correlating the training modeled optical images with their corresponding acquired optical images; and
   adjusting the light and pattern characteristic parameters and repeating the operations for inputting the training high-resolution images into the NF model, inputting the training NF images into the optical model, and correlating the training modeled optical images until such correlating operation results in a maximum correlation between the training modeled optical images and their corresponding acquired optical images.

6. The method of claim 4, wherein modeling the first and second sets of modeled optical images is performed with respect to the first and second set of high-resolution images after they have been smoothed to remove noise introduced by the high-resolution inspector and have been binarized by a normalization process, and the correlating of each of the first and second set of modelled optical images with corresponding acquired optical images is performed after such first and second modeled optical images are down-sampled so that their resolution and/or size are the same as a resolution and size of the corresponding acquired optical images.

7. The method of claim 4, further comprising:
shifting each modelled optical image with respect to its corresponding acquired image by an offset that is determined by aligning a one of the training modeled optical images with a corresponding one of the acquired images, wherein the shifting results in one or more noise events in a high-resolution image from the first set of high-resolution images being accurately correlated with a corresponding candidate event in the corresponding acquired optical image.

8. The method of claim 3, further comprising:
after correlating the first and second set of modelled images, determining whether the sample is to be processed further with or without repair or discarded based on review of the high-resolution images, the classified unambiguous events, and the identified noise and subsurface events if any.

9. The method of claim 1, wherein the high-resolution inspector is a scanning electron (SEM) microscope.

10. A high-resolution inspector system for inspecting a semiconductor sample, comprising at least one processor and memory that are operable for performing the following operations:
providing a plurality of locations corresponding to a plurality of candidate defect events on a semiconductor sample from an optical inspector operable to acquire a plurality of acquired optical images from which such candidate defect events are detected at their corresponding locations across the sample;
acquiring high-resolution images of the plurality of candidate defect events at their corresponding locations on the sample;
correlating each of a first set of modelled optical images, which have been modeled from a first subset of the acquired high-resolution images, with a corresponding one of a first set of the acquired optical images, to identify a plurality of surface noise events, as shown in the first set of high-resolution images, as sources for the corresponding candidate defect events in the first set of acquired optical images, wherein the correlating of each of the first set of modelled optical images results in identification of the surface noise events as sources if the corresponding modelled and acquired optical images are substantially identical; and
correlating each of a second set of modelled optical images, which have been modeled from a second subset of the acquired high-resolution images, with a corresponding one of a second set of the acquired optical images so that noise events are not identified as sources and, instead, subsurface events are identified as sources for the corresponding candidate defect events in the second set of acquired optical images.

11. The system of claim 10, wherein each candidate event represents a surface defect event, one or more noise events, or a subsurface event present on the sample.

12. The system of claim 10, wherein the at least one processor and memory are further operable for, prior to correlating the first and second set of modelled images with their corresponding first and second sets of acquired optical images, analyzing the high-resolution images to classify the candidate events into ambiguous and unambiguous events, wherein each high-resolution image in the first and second set of high-resolution images is associated with a classified ambiguous event, wherein each unambiguous event is a bridge, break, protrusion, intrusion, or other known defect types, wherein the ambiguous events were unclassifiable as a known defect type.

13. The system of claim 12, wherein the at least one processor and memory are further operable for:
training a near field (NF) model to model a plurality of NF images from corresponding acquired high-resolution images, wherein the NF model is trained with a set of training high-resolution images that correspond to unambiguous and classified events;
modeling the first and second sets of modeled optical images by modeling a plurality of corresponding NF images from the first and second sets of acquired high-resolution images using the trained NF model and modeling the first and second sets of modeled optical images from the corresponding NF images using an optical tool model for the optical inspector.

14. The system of claim 13, wherein the NF model is configured to simulate light reflected and scattered, with a plurality of light characteristic parameters, from a wafer pattern, having a set of pattern characteristic parameters, that is represented in the corresponding high-resolution images, wherein the NF model is trained by:
inputting the training high-resolution images into the NF model to model corresponding training NF images based on the light and pattern characteristic metrics;
inputting the training NF images that were modelled from the training high-resolution images into the optical model to model corresponding training modeled optical images;
correlating the training modeled optical images with their corresponding acquired optical images; and
adjusting the light and pattern characteristic parameters and repeating the operations for inputting the training high-resolution images into the NF model, inputting the training NF images into the optical model, and correlating the training modeled optical images until such correlating operation results in a maximum correlation between the training modeled optical images and their corresponding acquired optical images.

15. The system of claim 13, wherein modeling the first and second sets of modeled optical images is performed with respect to the first and second set of high-resolution images after they have been smoothed to remove noise introduced by the high-resolution inspector and have been binarized by a normalization process, and the correlating of each of the first and second set of modelled optical images with corresponding acquired optical images is performed after such first and second modeled optical images are down-sampled so that their resolution and/or size are the same as a resolution and size of the corresponding acquired optical images.

16. The system of claim 13, wherein the at least one processor and memory are further operable for:
shifting each modelled optical image with respect to its corresponding acquired image by an offset that is determined by aligning a one of the training modeled optical images with a corresponding one of the acquired images, wherein the shifting results in one or more noise events in a high-resolution image from the first set of high-resolution images being accurately correlated with a corresponding candidate event in the corresponding acquired optical image.

17. The system of claim 12, wherein the at least one processor and memory are further operable for:
after correlating the first and second set of modelled images, determining whether the sample is to be processed further with or without repair or discarded based on review of the high-resolution images, the classified unambiguous events, and the identified noise and sub-surface events if any.

18. The system of claim 10 comprising a SEM system.

* * * * *